(12) United States Patent
Bao et al.

(10) Patent No.: US 11,393,725 B2
(45) Date of Patent: *Jul. 19, 2022

(54) MULTI-METAL DIPOLE DOPING TO OFFER MULTI-THRESHOLD VOLTAGE PAIRS WITHOUT CHANNEL DOPING FOR HIGHLY SCALING CMOS DEVICE

(71) Applicant: INTERNATIONAL BUSINESS MACHINES CORPORATION, Armonk, NY (US)

(72) Inventors: Ruqiang Bao, Niskayuna, NY (US); Vijay Narayanan, New York, NY (US); Terence B. Hook, Jericho, VT (US); Hemanth Jagannathan, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 127 days.

This patent is subject to a terminal disclaimer.

(21) Appl. No.: 16/582,408

(22) Filed: Sep. 25, 2019

(65) Prior Publication Data

US 2020/0020594 A1 Jan. 16, 2020

Related U.S. Application Data

(63) Continuation of application No. 15/996,748, filed on Jun. 4, 2018, now Pat. No. 10,546,787.

(51) Int. Cl.
*H01L 21/8238* (2006.01)
*H01L 21/02* (2006.01)
*H01L 21/324* (2006.01)
*H01L 21/225* (2006.01)
*H01L 27/092* (2006.01)
(Continued)

(52) U.S. Cl.
CPC ............ *H01L 21/823807* (2013.01); *H01L 21/02532* (2013.01); *H01L 21/02592* (2013.01);
(Continued)

(58) Field of Classification Search
CPC ......... H01L 21/823807; H01L 29/1033; H01L 21/823842; H01L 21/02532; H01L 27/092;
(Continued)

(56) References Cited

U.S. PATENT DOCUMENTS 8,420,474 B1 4/2013 Frank et al.
8,936,976 B2 1/2015 Radosavljevic et al.
(Continued)

OTHER PUBLICATIONS

List of IBM Patents or Patent Applications Treated as Related dated Sep. 25, 2019, 2 pages.
(Continued)

*Primary Examiner* — Thanh T Nguyen
(74) *Attorney, Agent, or Firm* — Tutunjian & Bitetto, P.C.; Samuel Waldbaum

(57) ABSTRACT

A method for fabricating a semiconductor device including multiple pairs of threshold voltage (Vt) devices includes forming a stack on a base structure having a first region corresponding to a first pair of Vt devices, a second region corresponding to a second pair of Vt devices and a third region corresponding to a third pair of Vt devices. The stack includes a first dipole layer, a first sacrificial layer formed on the first dipole layer, a second sacrificial layer formed on the first sacrificial layer, and a third sacrificial layer formed on the second sacrificial layer. The method further includes forming a second dipole layer different from the first dipole layer.

20 Claims, 12 Drawing Sheets

(51) Int. Cl.
  H01L 29/10     (2006.01)
  H01L 29/51     (2006.01)
  H01L 21/027    (2006.01)
  H01L 21/311    (2006.01)
(52) U.S. Cl.
  CPC ........ *H01L 21/2254* (2013.01); *H01L 21/324* (2013.01); *H01L 21/823842* (2013.01); *H01L 27/092* (2013.01); *H01L 29/1033* (2013.01); *H01L 29/517* (2013.01); *H01L 21/0274* (2013.01); *H01L 21/31111* (2013.01); *H01L 21/31116* (2013.01)
(58) Field of Classification Search
  CPC .............. H01L 21/324; H01L 21/02592; H01L 29/517; H01L 21/2254; H01L 21/0274; H01L 21/31111; H01L 21/31116
  See application file for complete search history.

(56) References Cited

U.S. PATENT DOCUMENTS

| | | | |
|---|---|---|---|
| 9,306,022 B1 | 4/2016 | Oh | |
| 9,312,183 B1 | 4/2016 | Kim et al. | |
| 9,620,612 B2 | 4/2017 | Xu et al. | |
| 10,546,787 B2* | 1/2020 | Bao | ........................ H01L 29/517 |
| 2010/0164011 A1 | 7/2010 | Frank et al. | |
| 2015/0035073 A1 | 2/2015 | Ando et al. | |
| 2019/0148237 A1* | 5/2019 | Wang | .................. H01L 29/4966 |
| | | | 257/288 |
| 2020/0357700 A1 | 11/2020 | Wang | |

OTHER PUBLICATIONS

T. Ando et al. Understanding Mobility Mechanisms in Extremely Scaled HfO2 (EOT 0.42 nm) Using Remote Interfacial Layer Scavenging Technique and V-tuning Dipoles with Gate-First Process Electron Devices Meeting (IEDM), 2009 IEEE International Dec. 7-9, 2009 pp. 17.1.1-17.1.4 IEEE.

Koji Kita et al. Origin of electric dipoles formed at high-k/SiO2 interface Applied Physics Letters 94, 132902 2009 Apr. 2009 pp. 132902-1-132902-3 vol. 94 Issue 13 American Institute of Physics.

Office Action in corresponding U.S. Appl. No. 16/582,440 dated Apr. 1, 2021 (17 pgs).

* cited by examiner

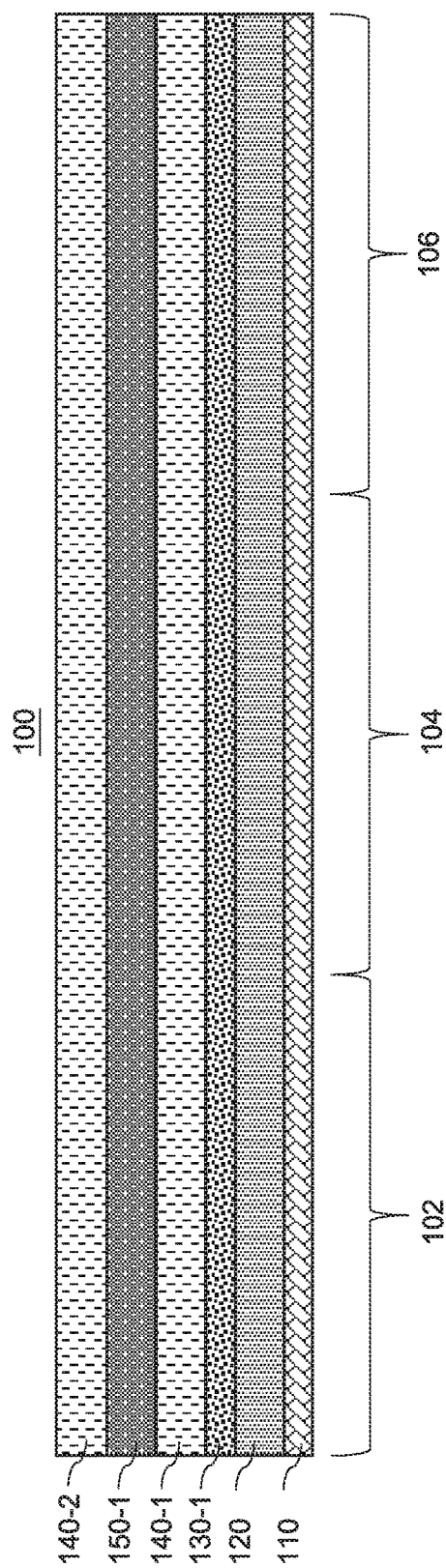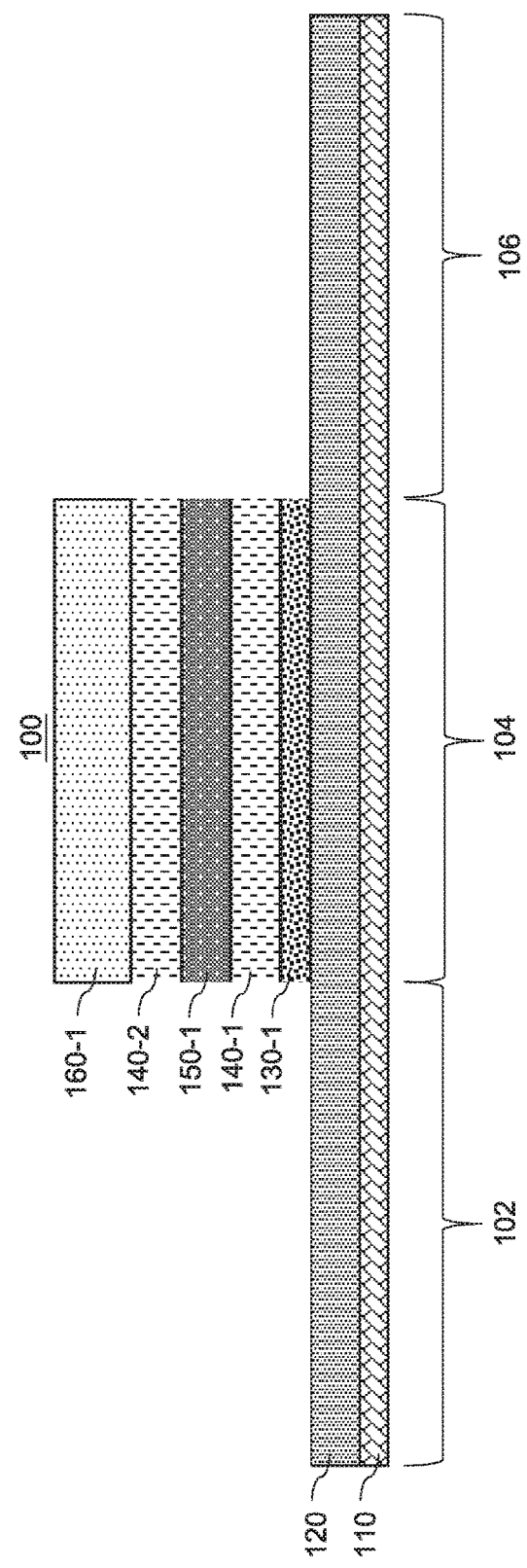

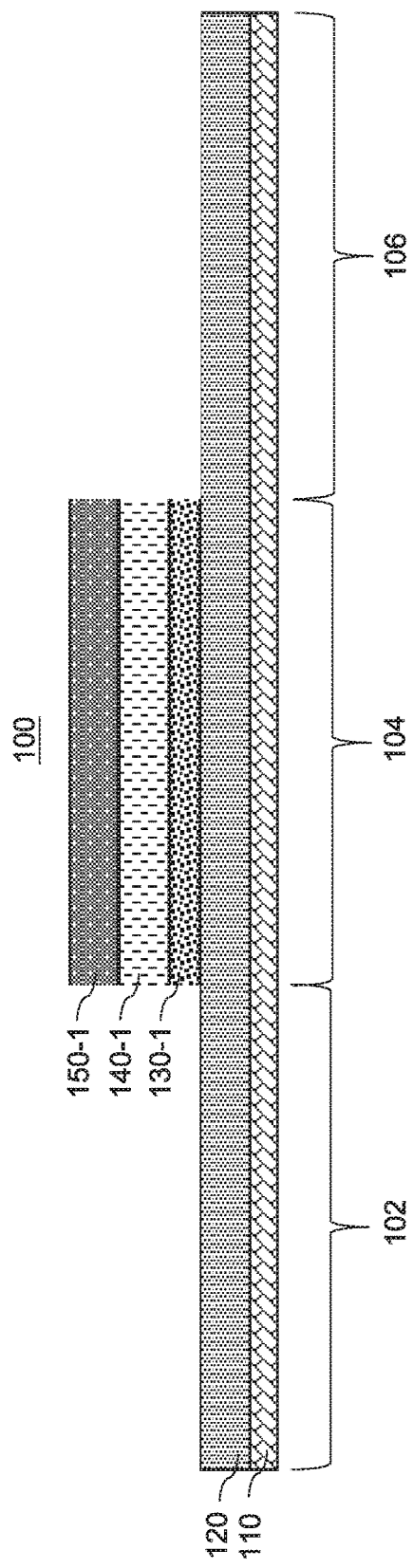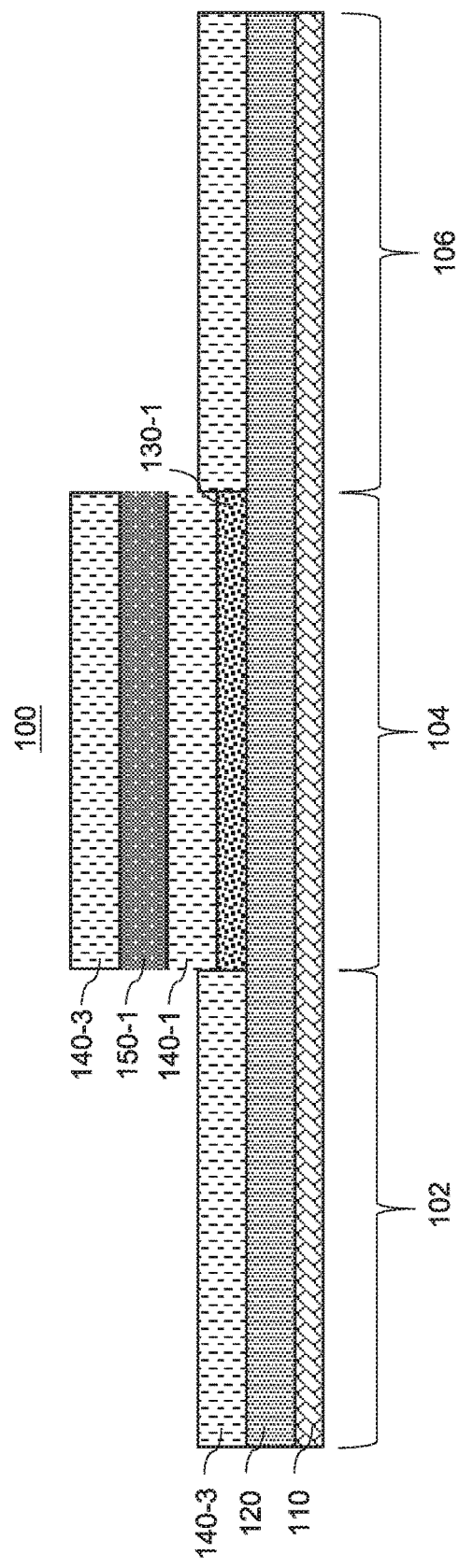

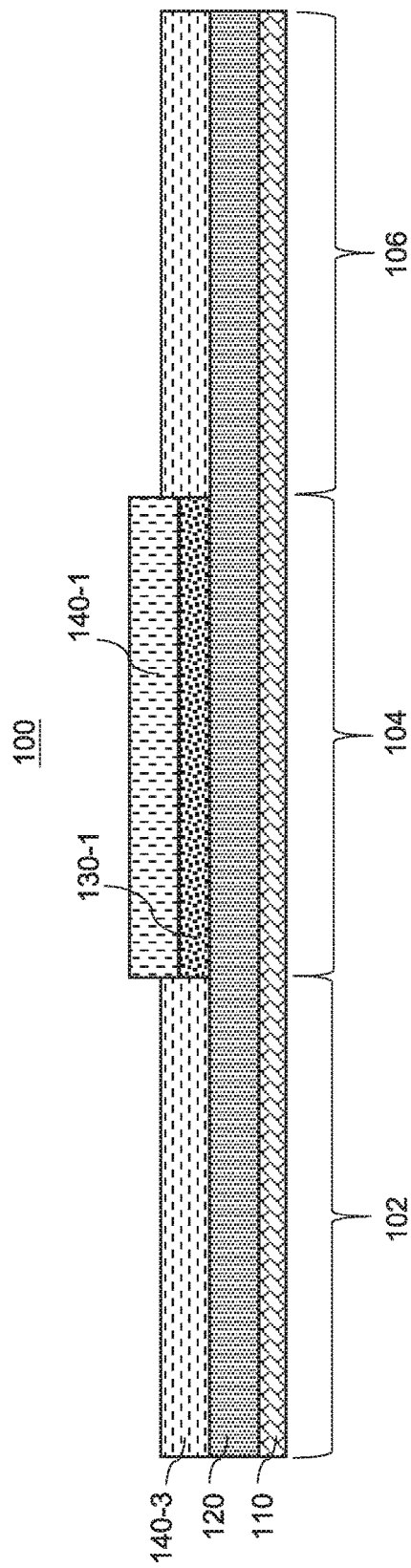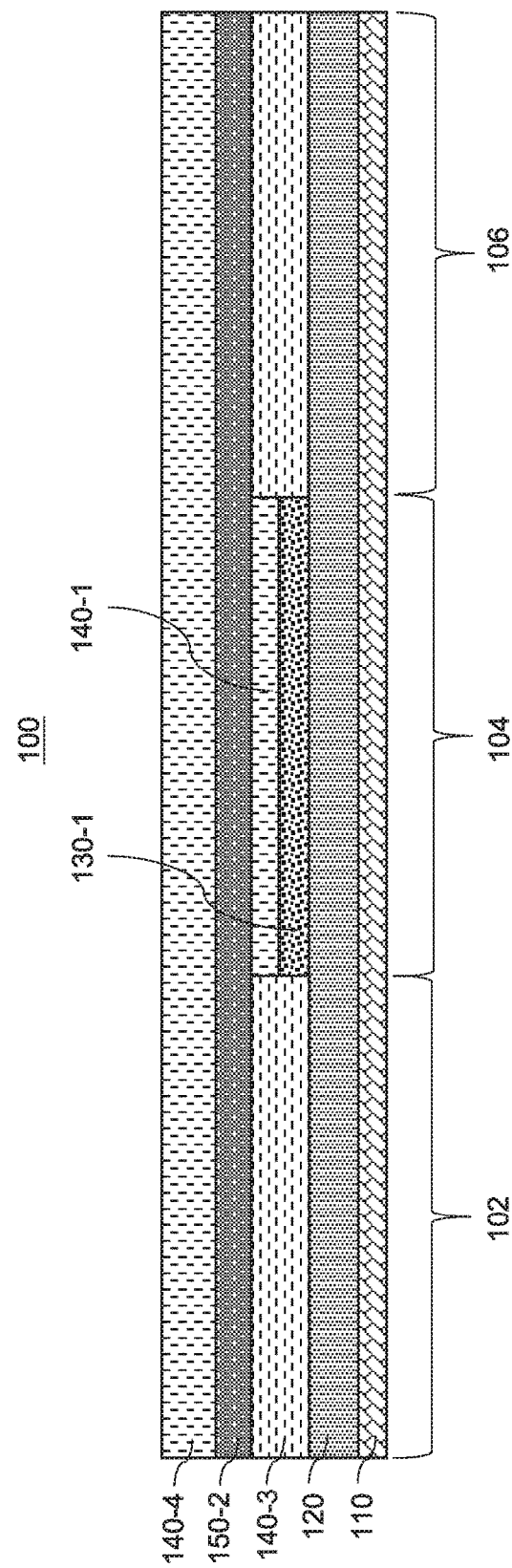

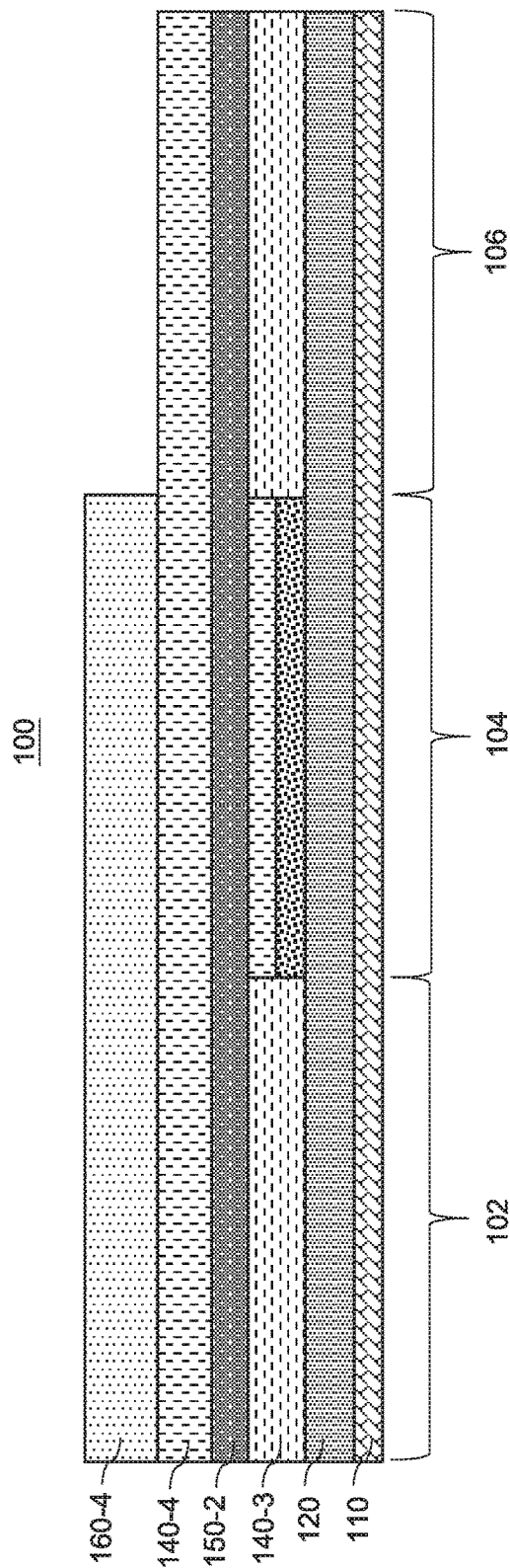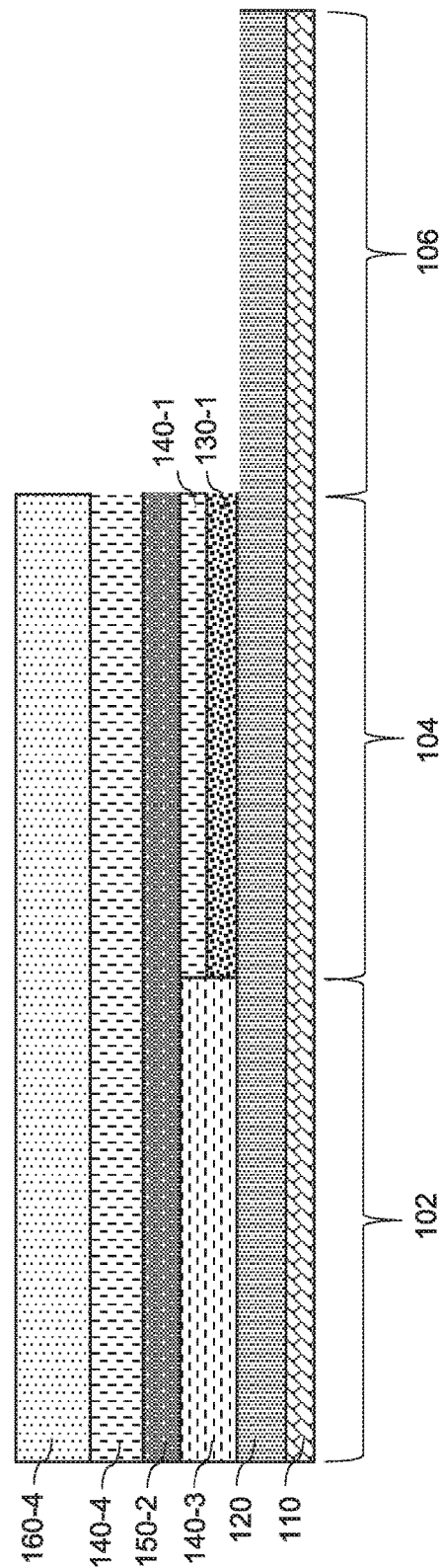

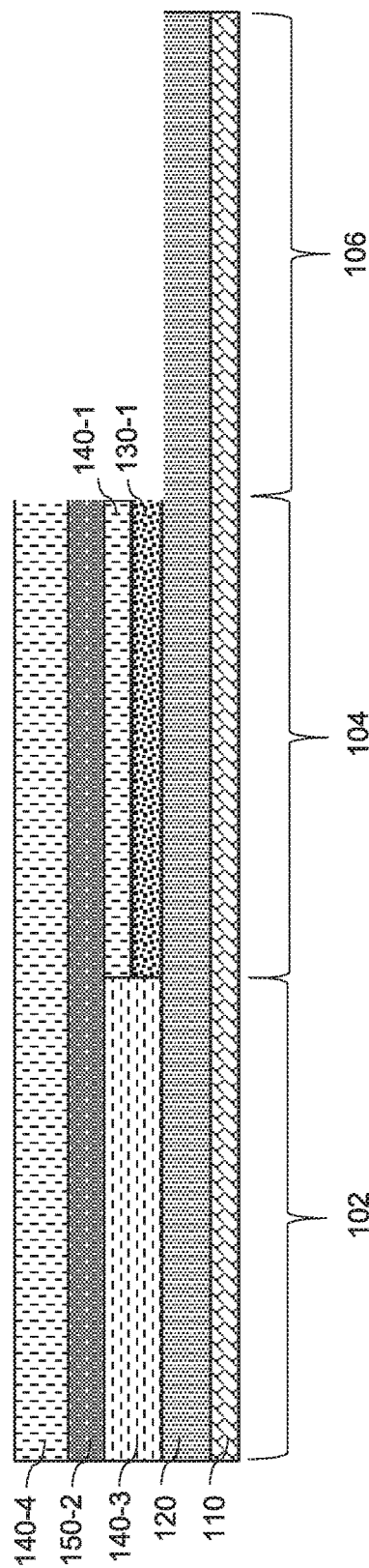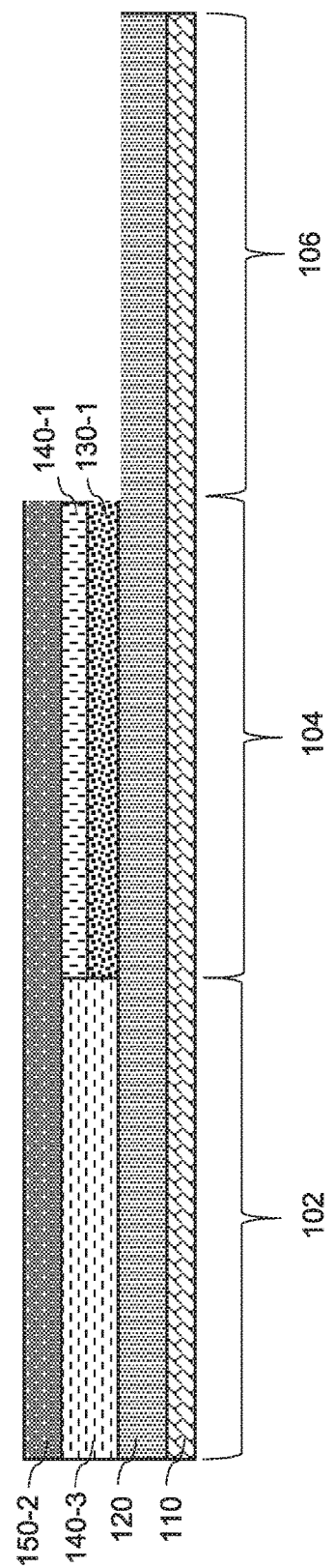

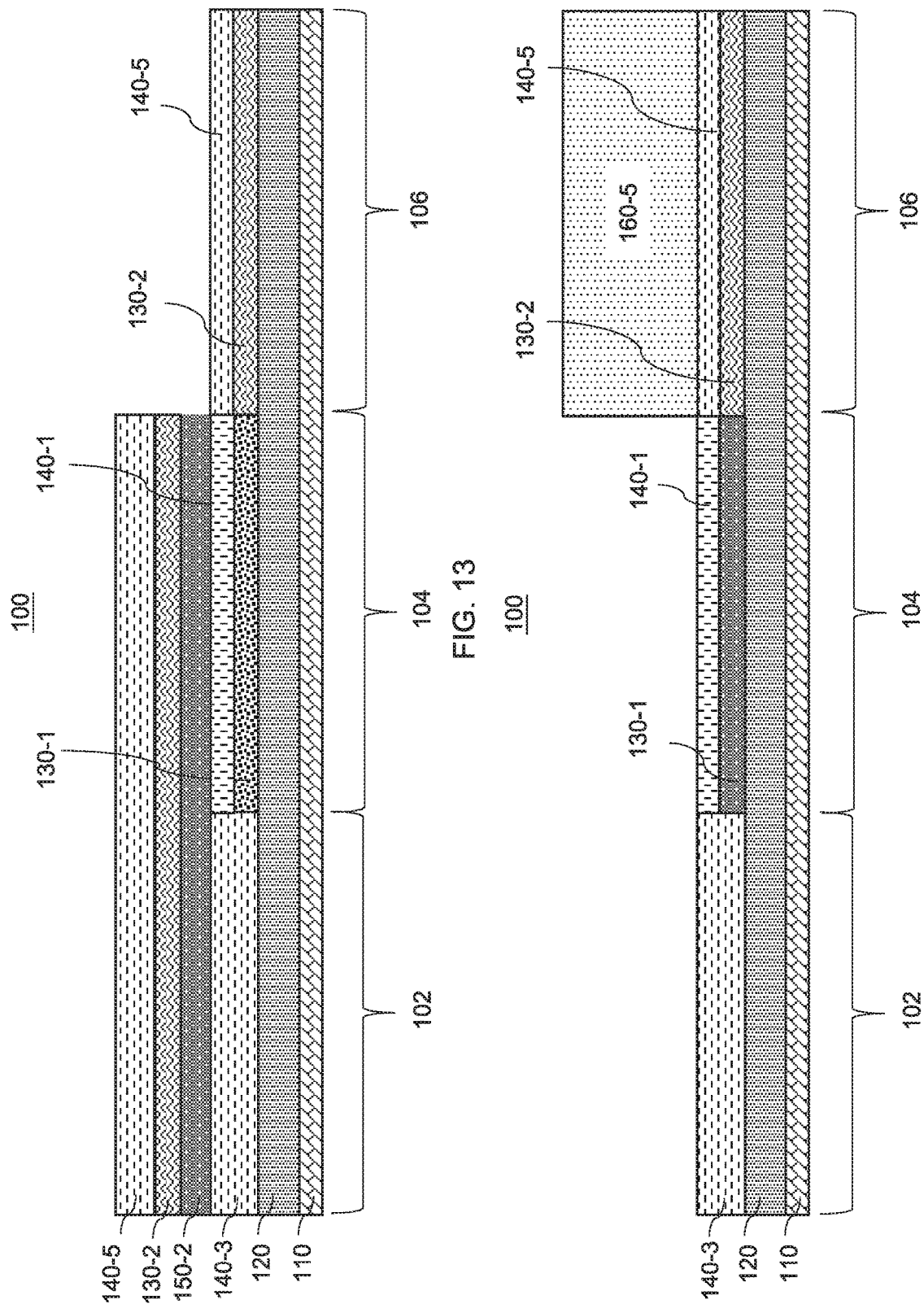

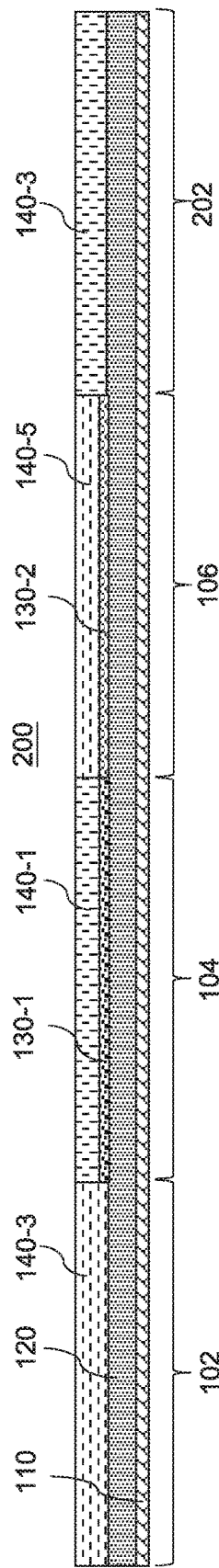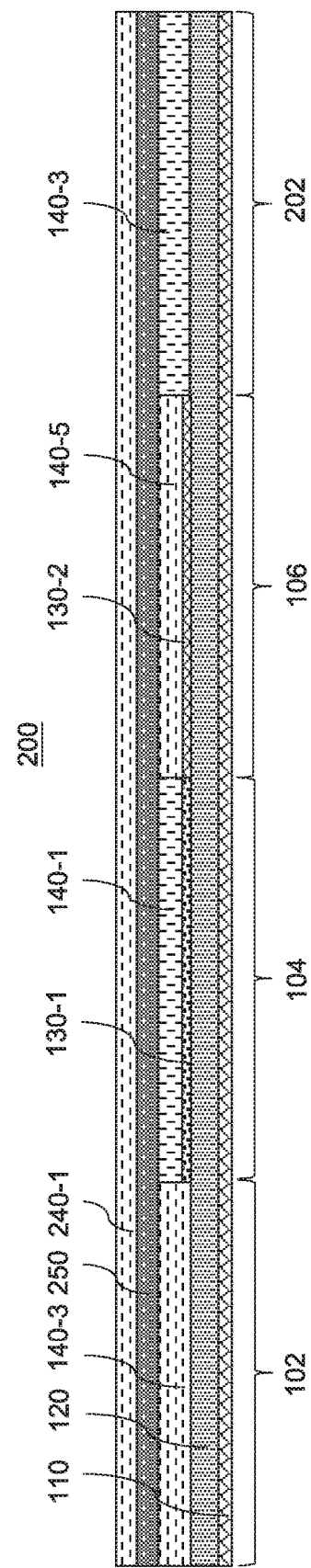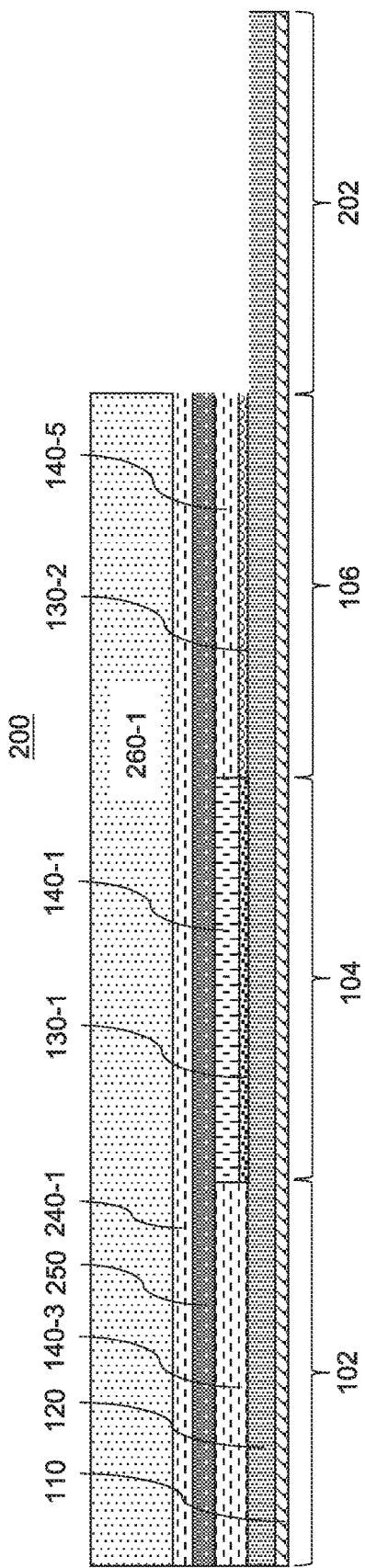

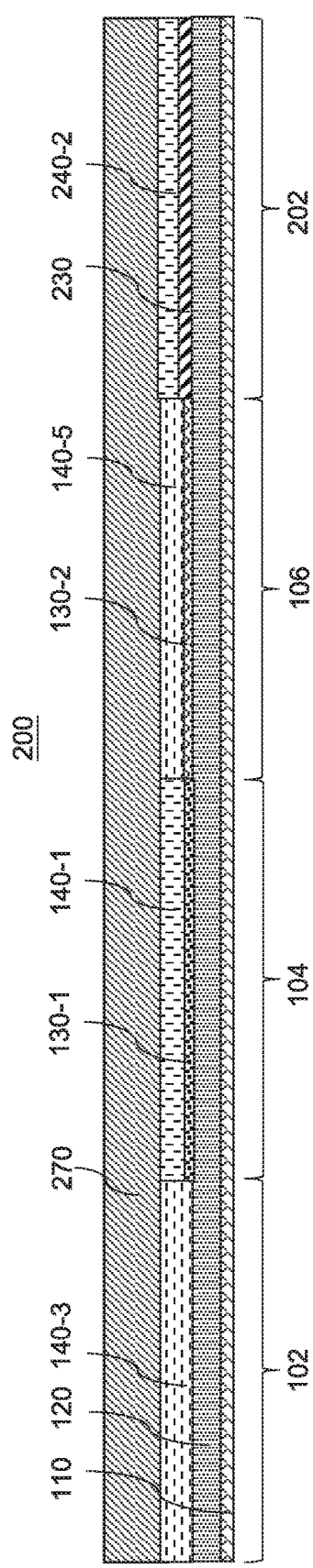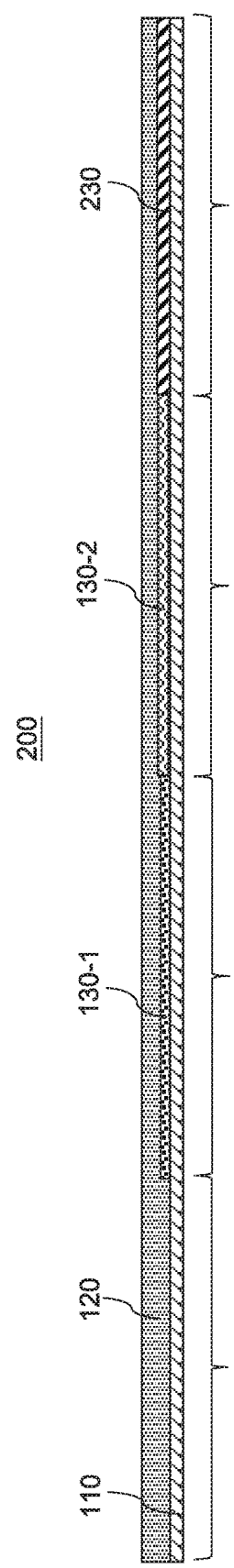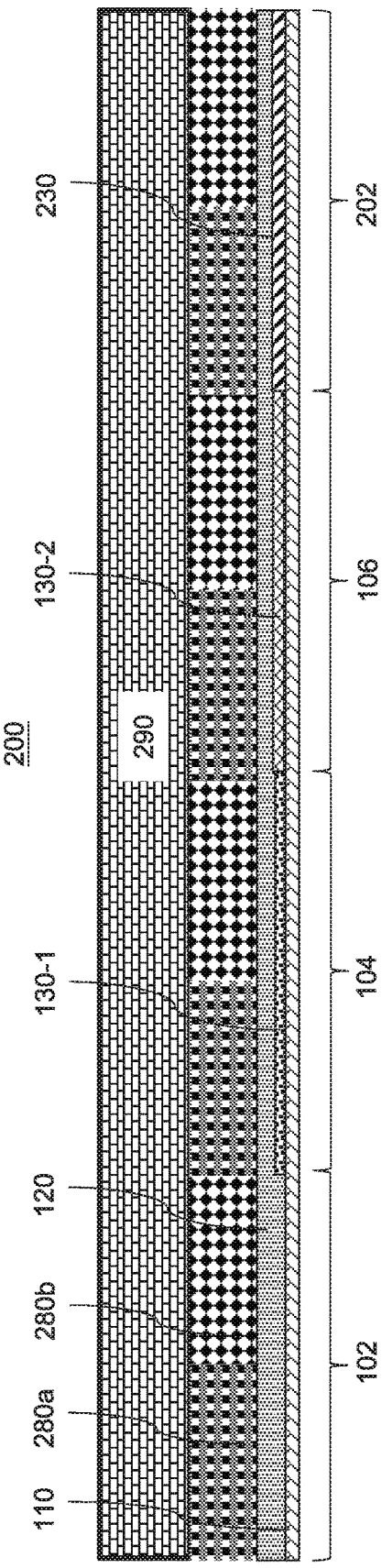

MULTI-METAL DIPOLE DOPING TO OFFER MULTI-THRESHOLD VOLTAGE PAIRS WITHOUT CHANNEL DOPING FOR HIGHLY SCALING CMOS DEVICE

BACKGROUND

Technical Field

The present invention generally relates to semiconductor devices, and more particularly to multiple threshold voltage (Vt) devices and methods of forming the same.

Description of the Related Art

A threshold voltage (Vt) of a field-effect transistor (FET) is a minimum gate voltage needed to create a conducting path between the source and drain of the FET. Low Vt devices switch faster, and thus can be used on critical delay paths to reduce clock periods. However, low Vt devices have high static leakage power. High Vt devices, which generally have a lower static leakage power as compared to low Vt devices, can be used on non-critical paths to reduce static leakage power without incurring a delay penalty. Multi-Vt devices, such as multi-Vt complementary metal-oxide-semiconductor (CMOS) devices, include transistors having multiple Vt's for optimizing, e.g., delay and power.

SUMMARY

In accordance an embodiment of the present invention, a method for fabricating a semiconductor device including multiple pairs of threshold voltage (Vt) devices is provided. The method includes forming a stack on a base structure having a first region corresponding to a first pair of Vt devices, a second region corresponding to a second pair of Vt devices and a third region corresponding to a third pair of Vt devices, the stack including a first dipole layer having a first thickness, a first sacrificial layer formed on the first dipole layer, a second sacrificial layer formed on the first sacrificial layer, and a third sacrificial layer formed on the second sacrificial layer; exposing the base structure in the third region; and forming a second dipole layer different from the first dipole layer.

In accordance with another embodiment of the present invention, a method for fabricating a semiconductor device including multiple pairs of threshold voltage (Vt) devices is provided. The method includes forming a stack on a base structure having a first region corresponding to a first pair of Vt devices, a second region corresponding to a second pair of Vt devices and a third region corresponding to a third pair of Vt devices. The stack includes a first dipole layer, a first sacrificial layer formed on the first dipole layer, a second sacrificial layer formed on the first sacrificial layer, and a third sacrificial layer formed on the second sacrificial layer. The method further includes forming a second dipole layer different from the first dipole layer.

In accordance with yet another embodiment of the present invention, a method for fabricating a semiconductor device including multiple pairs of threshold voltage (Vt) devices is provided. The method includes forming a stack on a base structure having a first region corresponding to a first pair of Vt devices, a second region corresponding to a second pair of Vt devices and a third region corresponding to a third pair of Vt devices. The stack includes a first dipole layer, a first sacrificial layer formed on the first dipole layer, a second sacrificial layer formed on the first sacrificial layer, and a third sacrificial layer formed on the second sacrificial layer. The method further includes forming a second dipole layer different from the first dipole layer, including forming the second dipole layer to include a different material than the first dipole layer.

In accordance with yet another embodiment of the present invention, a method for fabricating a semiconductor device including multiple pairs of threshold voltage (Vt) devices is provided. The method includes forming a stack on a base structure having a first region corresponding to a first pair of Vt devices, a second region corresponding to a second pair of Vt devices and a third region corresponding to a third pair of Vt devices. The stack includes a first dipole layer including a dipole material, a first sacrificial layer formed on the first dipole layer, a second sacrificial layer formed on the first sacrificial layer, and a third sacrificial layer formed on the second sacrificial layer. The method further includes forming a second dipole layer different from the first dipole layer, including forming the second dipole layer to include the dipole material having a different thickness.

In accordance with an embodiment of the present invention a semiconductor device including multiple pairs of threshold voltage (Vt) devices is provided. The device includes a first region corresponding to a first pair of Vt devices, a second region corresponding to a second pair of Vt devices including a first dipole layer, and a third region corresponding to a third pair of Vt devices including a second dipole layer different from the first dipole layer.

In accordance with another embodiment of the present invention a semiconductor device including multiple pairs of threshold voltage (Vt) devices is provided. The device includes a first region corresponding to a first pair of Vt devices, a second region corresponding to a second pair of Vt devices including a first dipole layer, a third region corresponding to a third pair of Vt devices including a second dipole layer different from the first dipole layer, and a fourth region corresponding to a fourth pair of Vt devices including a third dipole layer different from the first and second dipole layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a cross-sectional view of a stack including a dipole material and sacrificial layers formed during the fabrication of a semiconductor device, in accordance with an embodiment of the present invention;

FIG. 2 is a cross-sectional view of a first resist formed and patterning performed during the fabrication of the semiconductor device, in accordance with an embodiment of the present invention;

FIG. 3 is a cross-sectional view of the first resist and one of the sacrificial layers of the stack being removed during the fabrication of the semiconductor device, in accordance with an embodiment of the present invention;

FIG. 4 is a cross-sectional view of a sacrificial layer formed during the fabrication of the semiconductor device, in accordance with an embodiment of the present invention;

FIG. 7 is a cross-sectional view of the second and third resists being removed during the fabrication of the semiconductor device, in accordance with an embodiment of the present invention;

FIG. 8 is a cross-sectional view of sacrificial layers formed during the fabrication of the semiconductor device, in accordance with an embodiment of the present invention;

FIG. 9 is a cross-sectional view of a fourth resist formed during the fabrication of the semiconductor device, in accordance with an embodiment of the present invention;

FIG. 10 is a cross-sectional view of patterning performed during the fabrication of the semiconductor device, in accordance with an embodiment of the present invention;

FIG. 11 is a cross-sectional view of the fourth resist being stripped during the fabrication of the semiconductor device, in accordance with an embodiment of the present invention;

FIG. 12 is a cross-sectional view of a sacrificial layer being stripped during the fabrication of the semiconductor device, in accordance with an embodiment of the present invention;

FIG. 13 is a cross-sectional view of a dipole layer and a sacrificial layer formed during the fabrication of the semiconductor device, in accordance with an embodiment of the present invention;

FIG. 14 is a cross-sectional view of a fifth resist formed and patterning performed during the fabrication of the semiconductor device, in accordance with an embodiment of the present invention;

FIG. 19 is a cross-sectional view of a semiconductor device, in accordance with an alternative embodiment of the present invention;

FIG. 20 is a cross-sectional view of sacrificial layers formed during the fabrication of the semiconductor device, in accordance with an alternative embodiment of the present invention;

FIG. 21 is a cross-sectional view of patterning performed during the fabrication of the semiconductor device, in accordance with an alternative embodiment of the present invention;

FIG. 25 is a cross-sectional view of a semiconductor layer formed and anneal performed during the fabrication of the semiconductor device, in accordance with an alternative embodiment of the present invention;

FIG. 26 is a cross-sectional view of wet strip performed during the fabrication of the semiconductor device, in accordance with an alternative embodiment of the present invention; and FIG. 27 is a cross-sectional view of work function metal formation during the fabrication of the semiconductor device, in accordance with an alternative embodiment of the present invention.

DETAILED DESCRIPTION

Figure 5:
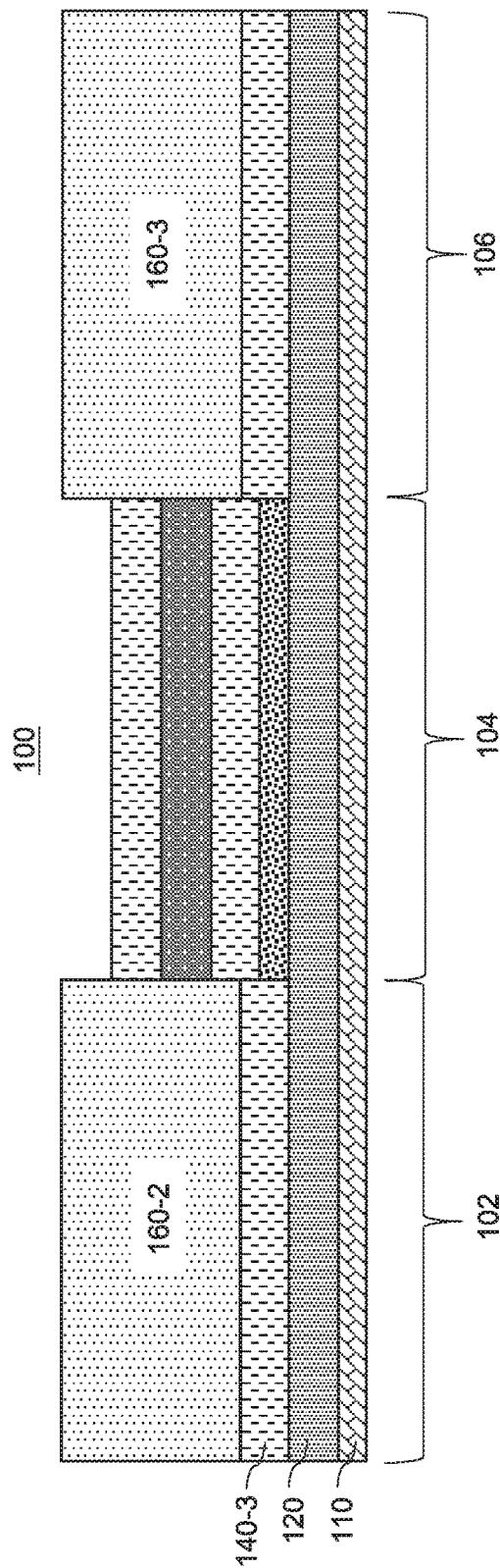
FIG. 5 is a cross-sectional view of second and third resists formed and patterning performed during the fabrication of the semiconductor device, in accordance with an embodiment of the present invention

Threshold voltage (Vt) tuning can be achieved in a plurality of ways, including channel doping and gate stack processing methods. Channel doping can degrade device performance, and only offers limited Vt tuning for e.g., logic devices. Channel doping can also offer poor mismatching for static random-access memory (SRAM) devices. In addition, for field-effect transistor (FET) devices such as gate all around (GAA) devices (e.g., nanosheet GAA FETs) and vertical transport FET (VTFET) devices, channel doping can be difficult to implement due to thin body.

Due to the problems/penalties associated with channel doping, gate stack processing methods for tuning Vt for a region are preferred due to less of a penalty. Gate stack processing methods can include employing, for example, a multi-layer metal gate method, a gate doping method, a gate stack dipole method, or combinations thereof. The multi-layer metal gate method can increase total gate stack thickness, which may not be a viable option for highly scaled FinFET devices due to, for example, small contacted poly pitch (CPP). Additionally, the multi-layer metal gate method may not be a viable option for recent device architectures like GAA FETs and vertical transport FETs (VTFETs) due to, for example, sensitivity to total gate stack thickness. The gate doping method can have a loading effect issue. Further, the gate doping method can provide problems with respect to manufacturability. Since the multi-layer gate and gate doping methods have at least the above-noted drawbacks, the gate stack dipole method can be the best option for achieving multi-Vt shift.

For example, different thicknesses of dipole layers that are formed by, e.g., different numbers of dipole patterning cycles, can correspond with different Vt's different numbers of dipole patterning cycles. One possible process to have more Vt pairs is by performing the following sequence: dipole patterning, anneal, sacrificial layer stripping, . . . , dipole patterning, anneal, sacrificial layer stripping. However, due to the multiple anneal cycles, an interfacial layer (IL) of the device can regrow too thick, thereby degrading device performance. Accordingly, such a process flow is not a manufacturable solution.

The embodiments described herein provide for the fabrication of semiconductor devices that integrate a dipole first patterning scheme and a dipole last patterning scheme before annealing to achieve multiple pairs of Vts without the above-noted IL regrowth problem associated with multiple anneal cycles. In one embodiment, three different Vt pairs corresponding to three respective pairs of device regions of a semiconductor device can be realized. In another embodiment, four different Vt pairs corresponding to four respective pairs device regions of a semiconductor device can be realized. However, it is to be understood and appreciated that any number of Vt pairs corresponding to any number of respective device regions of a semiconductor device can be realized by repeating process integration in accordance with the embodiments described herein should not be limiting.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-27 depict respective steps of a process flow for fabricating semiconductor devices including multiple gate regions having respective Vt's. In the illustrative embodiment depicted in FIGS. 1-18, a semiconductor device is shown including three pairs of gate regions having three pairs of respective Vt's. In the illustrative embodiment depicted in FIGS. 19-27, a semiconductor device is shown including four pairs of gate regions having four pairs of respective Vt's. However, a semiconductor device having any number of pairs of gate regions having respective pairs of Vt's can be fabricated, in accordance with the embodiments described herein.

Referring to FIG. 1, a cross-sectional view is provided showing an exemplary semiconductor device 100 having regions 102, 104 and 106. In one embodiment, each region 102-106 is associated with a corresponding CMOS device. For example, each region 102-106 can be associated with an n-type MOS (NMOS) device and a p-type MOS (PMOS) device. As will be described in further detail, the device formed in region 102 can be or is associated with a first Vt corresponding to a lack of a dipole layer, the device formed in region 104 can be or is associated with a second Vt corresponding to a dipole layer having a first thickness, and the device formed in region 106 can be or is associated with a third Vt corresponding to a dipole layer having a second thickness. As will be further described herein, all three regions 102, 104 and 106 share dual work function metals.

As further shown, a base structure including an interfacial layer (IL) 110 and a dielectric layer 120, and a stack including a first dipole layer 130-1 and sacrificial layers 140-1, 150-1 and 140-2 are formed across the regions 102-106.

The IL layer 110 can include a dielectric material. For example, the IL layer 110 can include silicon dioxide ($SiO_2$). However, any suitable material can be used to form the IL layer 110, in accordance with the embodiments described herein. In one embodiment, the IL layer 110 has a thickness that ranges from, e.g., about 0.5 nm to about 5 nm. More specifically, the IL layer 110 can have a thickness of, e.g., about 1 nm. The IL layer 110 can be formed using any suitable process in accordance with the embodiments described herein. In one embodiment, the IL layer 110 could be formed by a dual dielectric layer stack. For example, the dual dielectric layer stack can include 3 nm $SiO_2$ plus 1 nm $SiO_2$.

The dielectric layer 120 can illustratively include a high-k dielectric material. A high-k material is a dielectric material that has a dielectric constant k higher than that of $SiO_2$ at room temperature (e.g., about 20° C.-25° C.) and atmospheric pressure (about 1 atm). Some examples of high-k dielectric materials suitable for the dielectric layer 120 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the high-k gate dielectric layer 15 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof. In one embodiment, the dielectric layer 120 has a thickness that ranges from, e.g., about 1 nm to about 4 nm. In another embodiment, the dielectric layer 120 has a thickness that ranges from, e.g., about 1 nm to about 2 nm. More specifically, the dielectric layer 120 can have a thickness of, e.g., about 1.7 nm. The dielectric layer 120 can be formed using any suitable process in accordance with the embodiments described herein.

The dipole layer 130-1 can include any suitable dipole material in accordance with the embodiments described herein. For example, the dipole layer 130-1 can include at least one of lanthanum oxide ($La_2O_3$), magnesium oxide (MgO), yttrium oxide ($Y_2O_3$), aluminum oxide ($Al_2O_3$). In one embodiment, the dipole layer 130-1 can have a thickness that ranges from, e.g., about 0.1 nm to about 1 nm. In another embodiment, the dipole layer 130-1 can have a thickness that ranges from, e.g., about 0.1 nm to about 0.5 nm. The dipole layer 130-1 can be formed using any suitable process in accordance with the embodiments described herein. The Vt corresponding to region 104 is a function of the thickness of the dipole layer 130-1.

The sacrificial layer 150-1 can include an etch stop layer. For example, the sacrificial layer 150-1 can include at least one of an oxide layer (e.g., low temperature $SiO_2$), $Al_2O_3$, and $La_2O_3$, and a Si layer (e.g., amorphous Si). One or more of the materials can be formed by, e.g., atomic layer deposition (ALD). In one embodiment, the sacrificial layer 150-1 has a thickness that ranges from, e.g., about 0.5 nm to about 2 nm. More specifically, the sacrificial layer 150-1 can have a thickness of e.g., about 1 nm. The sacrificial layer 150-1 can be formed using any suitable process in accordance with the embodiments described herein. In one embodiment, the sacrificial layers 140-1 and 140-2 can include titanium nitride (TiN).

The material of the sacrificial layers 140-1 and 140-2 can be selected based at least in part on etch resistance properties of the materials of the dipole layer 130-1 and sacrificial layer 150-1. For example, the material of the sacrificial layer 150-1 formed between the sacrificial layers 140-1 and 140-2 can be chosen to be highly resistant to wet etch chemistries that include hydrogen peroxide ($H_2O_2$), such as standard clean 1 (SC1) and/or standard clean 2 (SC2) chemistries, and exhibits complementarity. Furthermore, in the embodiment in which the sacrificial layers 140-1 and 140-2 include TiN, the material of the sacrificial layer 150-1 can be chosen so that it is easily removable by wet etch chemistries that include, e.g., ammonia (e.g., hot ammonia), and/or hydrochloric acid (HCl), which do not attack TiN. As will be described in further detail, such wet etch chemistries can be employed during the fabrication of the device 100.

In one embodiment, the sacrificial layers 140-1 and 140-2 have a thickness that range from, e.g., about 0.5 nm to about 3 nm. In another embodiment, the sacrificial layers 140-1 and 140-2 have a thickness that ranges from, e.g., about 1 nm to about 1.5 nm. The sacrificial layers 140-1 and 140-2 can be formed using any suitable process in accordance with the embodiments described herein.

Referring to FIG. 2, a first patterning process is performed. In one embodiment, the first patterning process includes a photolithography process. For example, as shown, a resist 160-1 can be formed on the sacrificial layer 140-2 using any suitable process in accordance with the embodiments described herein. After the resist 160-1 is formed, the resist 160-1 can be exposed to a pattern of radiation (e.g., light), and the pattern can be developed into the resist 160-1 utilizing a resist developer. After the patterning is complete, one or more etch processes can be performed to remove material from the unprotected regions 102 and 106, up to the dielectric layer 120. In one embodiment, the one or more etch processes include a dry etch process, such as reactive-ion etching (RIE), and a wet etch process. The removal of the dipole layer 130-1, the sacrificial layers 140-1, and 140-2 and sacrificial layer 150-1 could be done in one step or could be done via layer by layer by using wets. In the embodiment in which the dielectric layer 120 includes $HfO_2$, the wet etch process can employ SC2 or an SC2-like solution to remove the layers above the dielectric layer 120 from the regions 102 and 106 due to $HfO_2$ being resistant to such solutions.

Referring to FIG. 3, the resist 160-1 and the sacrificial layer 140-2 are removed. The resist 160-1 can be removed using any suitable resist stripping technique in accordance with the embodiments described herein. The sacrificial layer 140-2 can be removed by any suitable etch process in accordance with the embodiments described herein. For example, the sacrificial layer 140-2 can be removed using a wet etch process that employs a solution capable of selectively removing the sacrificial layer 140-2 while stopping on the sacrificial layer 150-1. In the embodiment in which the sacrificial layer 140-2 includes TiN, the wet etch process for removing the sacrificial layer 140-2 can employ a solution including $H_2O_2$ (e.g., SC1).

Referring to FIG. 4, a sacrificial layer 140-3 is formed, similar to how the sacrificial layers 140-1 and 140-2 were formed. After the sacrificial layer 140-3 is formed, a second pattern process can be performed. In one embodiment, the second patterning process include a photolithography process.

For example, referring to FIG. 5, a resist 160-2 can be formed on the sacrificial layer 140-3 in the region 102 and a resist 160-3 can be formed on the sacrificial layer 140-3 in the region 106. After the resist 160-2 and 160-3 are formed, the resists 160-2 and 160-3 can be exposed to a pattern of radiation (e.g., light), and the pattern can be developed into the resists 160-2 and 160-3 utilizing a resist developer.

Figure 6:
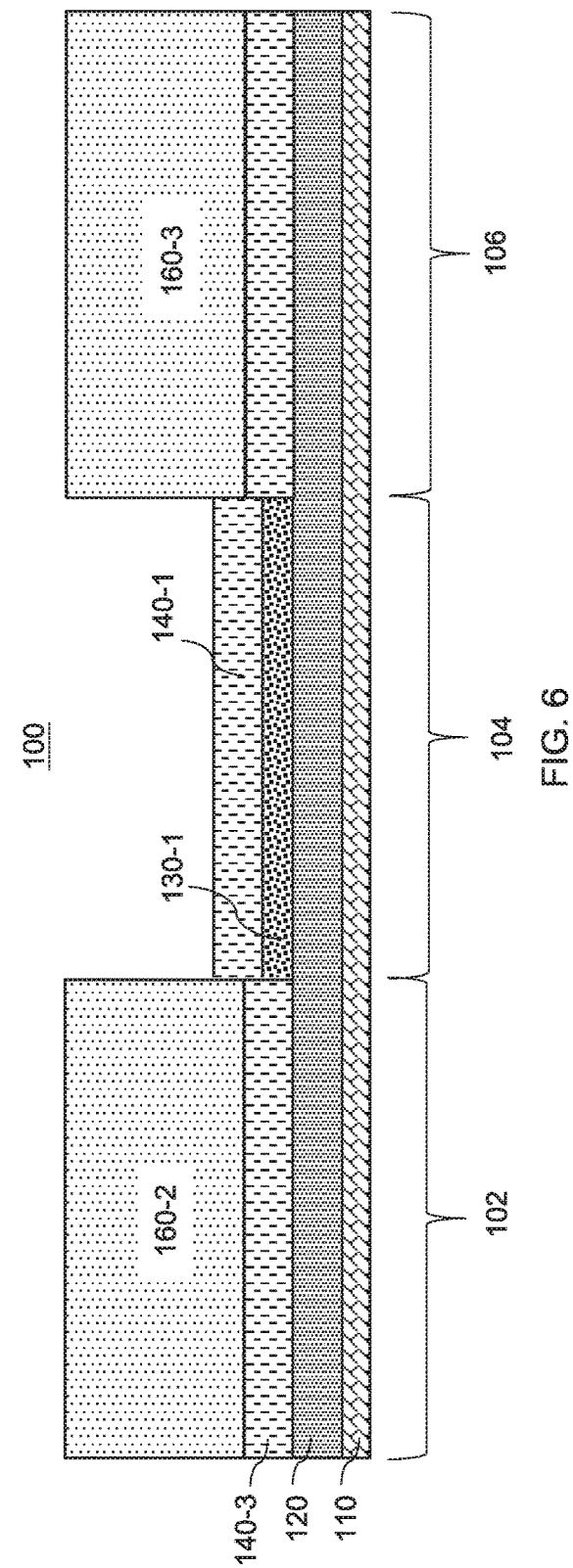
FIG. 6 is a cross-sectional view of sacrificial layers being removed during the fabrication of the semiconductor device, in accordance with an embodiment of the present invention.

Referring to FIG. 6, after the patterning is complete, one or more etch processes can be performed to remove material from the unprotected region 104, up to the sacrificial layer 140-1. In one embodiment, the one or more etch processes include a dry etch process, such as RIE, and a wet etch process. In the embodiment in which the sacrificial layer 140-3 includes TiN and the sacrificial layer 150-1, a first solution including hydrogen peroxide ($H_2O_2$) (e.g., SC1) can be employed to selectively remove the sacrificial layer 140-3 from the region 104, and then a second solution can be employed to remove the sacrificial layer 150-1 from the region 104.

Referring to FIG. 7, the resists 160-2 and 160-3 are removed using any suitable resist stripping technique in accordance with the embodiments described herein.

Referring to FIG. 8, a sacrificial layer 150-2 and a sacrificial layer 140-4 are formed, similar to how the sacrificial layers 150-1 and 140-1 were formed, respectively. After the sacrificial layers 150-2 and 140-4 are formed, a third pattern process can be performed. In one embodiment, the third patterning process include a photolithography process.

For example, referring to FIG. 9, a resist 160-4 can be formed on the sacrificial layer 140-2 in the regions 102 and 104 using any suitable process in accordance with the embodiments described herein. After the resist 160-4 is formed, the resist 160-4 can be exposed to a pattern of radiation (e.g., light), and the pattern can be developed into the resist 160-4 utilizing a resist developer.

Referring to FIG. 10, after the patterning is complete, one or more etch processes can be performed to remove material from the unprotected region 106, up to the dielectric layer 120. In one embodiment, the one or more etch processes include a dry etch process, such as RIE, and a wet etch process. In the embodiment in which the dielectric layer 120 includes $HfO_2$, the wet etch process can employ SC2 or an SC2-like solution to remove the dielectric layer 120 from the regions 102 and 106 due to $HfO_2$ being resistant to such solutions.

Referring to FIG. 11, the resist 160-4 is removed using any suitable resist stripping technique in accordance with the embodiments described herein.

Referring to FIG. 12, the remaining portion of the sacrificial layer 140-4 is removed utilizing any suitable process in accordance with the embodiments described herein. For example, in the embodiment in which the sacrificial layer 140-4 includes TiN and the sacrificial layer 150-1, a first solution including hydrogen peroxide ($H_2O_2$) (e.g., SC1) can be employed to selectively remove the sacrificial layer 140-4 from the regions 102 and 14.

Accordingly, processing steps are performed to expose the dielectric layer 120 of the base structure in the region 106.

Referring to FIG. 13, a dipole layer 130-2 and a sacrificial layer 140-5 are formed. The dipole layer 130-2 can include any suitable material in accordance with the embodiments described herein. For example, the dipole layer 130-2 can include at least one of $Al_2O_3$, MgO, $Y_2O_3$, and $La_2O_3$. In one embodiment, the dipole layer 130-2 can have a thickness that ranges from, e.g., about 0.2 nm to about 1.5 nm. In another embodiment, the dipole layer 130-2 can have a thickness that ranges from, e.g., about 0.2 nm to about 1 nm. The dipole layer 130-2 can be formed using any suitable process in accordance with the embodiments described herein.

The Vt corresponding to region 106 is a function of the thickness of the dipole layer 130-2. In one embodiment, the dipole layer 130-2 includes the same material as the dipole layer 130-1 but has a different thickness. In another embodiment, the dipole layer 130-2 could include a different material than the dipole layer 130-1, with the same or different thickness. The sacrificial layer 140-5 can be formed similar to how the sacrificial layer 140-1 was formed.

Referring to FIG. 14, a fourth patterning process is performed. In one embodiment, the first patterning process includes a photolithography process. For example, as shown, a resist 160-5 can be formed on the sacrificial layer 140-5 using any suitable process in accordance with the embodiments described herein. After the resist 160-5 is formed, the resist 160-5 can be exposed to a pattern of radiation (e.g., light), and the pattern can be developed into the resist 160-5 utilizing a resist developer. After the patterning is complete, one or more etch processes can be performed to remove material from the unprotected regions 102 and 104, up to the sacrificial layer 140-3 in the region 102 and the sacrificial layer 140-1 in the region 104. In one embodiment, the one or more etch processes include a dry etch process, such as RIE, and a wet etch process (e.g., SC1 or an SC1-like process).

Figure 15:
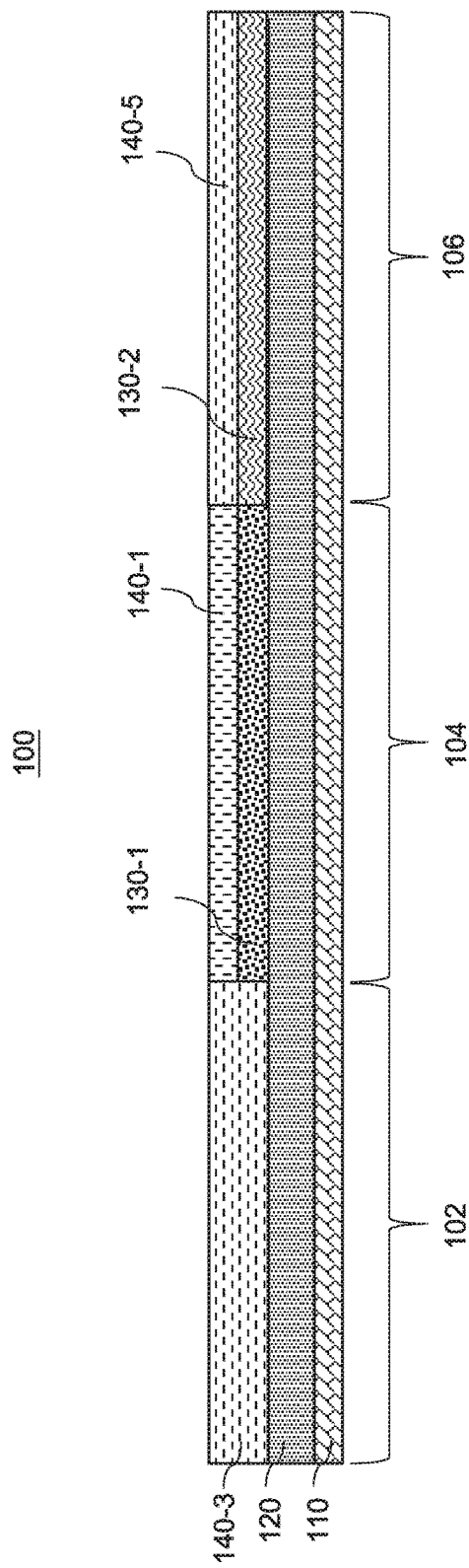
FIG. 15 is a cross-sectional view of the fifth resist being stripped during the fabrication of the semiconductor device, in accordance with an embodiment of the present invention.

Referring to FIG. 15, the resist 160-5 is removed using any suitable resist stripping technique in accordance with the embodiments described herein.

Figure 16:
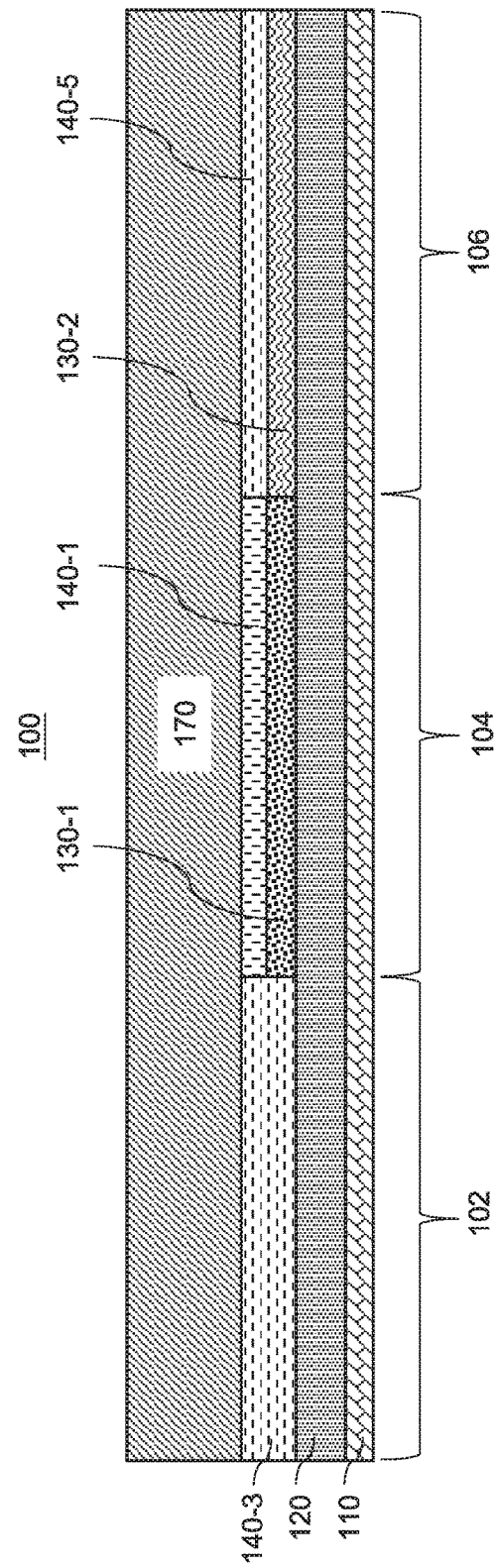
FIG. 16 is a cross-sectional view of a semiconductor layer formed and the anneal performed during the fabrication of the semiconductor device, in accordance with an embodiment of the present invention.

Referring to FIG. 16, a semiconductor layer 170 is formed on the sacrificial layer 140-3 in region 102, the sacrificial layer 140-1 in region 104 and the sacrificial layer 140-5 in region 106. In one embodiment, the semiconductor layer 170 includes amorphous silicon (a-Si). However, the semiconductor layer 170 can include any suitable material in accordance with the embodiments described herein. A drive-in anneal can then be performed utilizing any suitable anneal process in accordance with the embodiments described herein.

Figure 17:
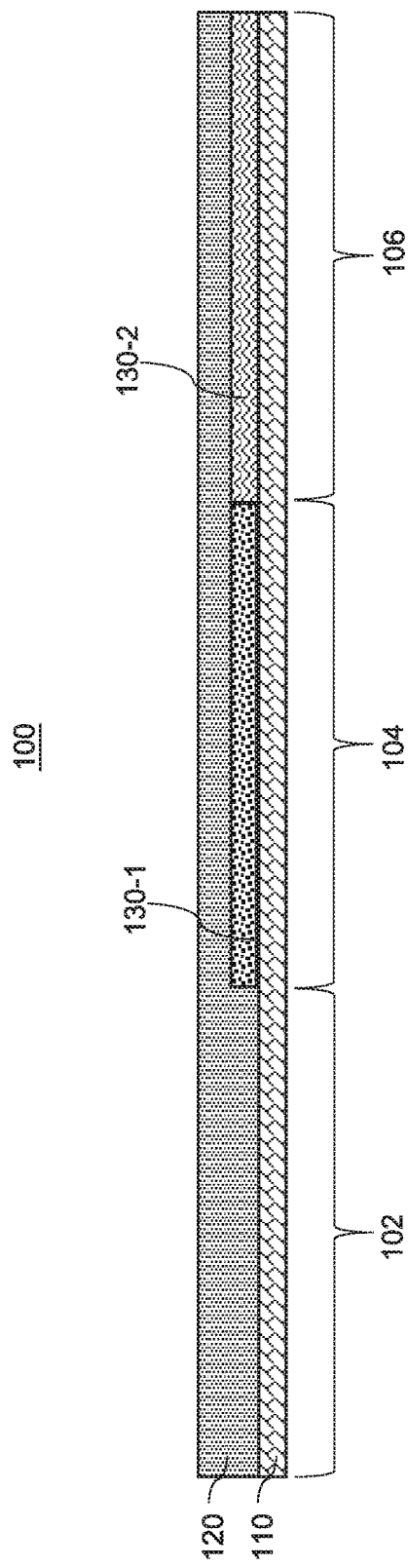
FIG. 17 is a cross-sectional view of wet strip performed during the fabrication of the semiconductor device, in accordance with an embodiment of the present invention.

Referring to FIG. 17, the semiconductor layer 170, the sacrificial layer 140-3 from region 102, the sacrificial layer 140-1 from region 104 and the sacrificial layer 140-5 from region 106 are removed. In one embodiment, removing these layers includes employing a wet strip.

Figure 18:
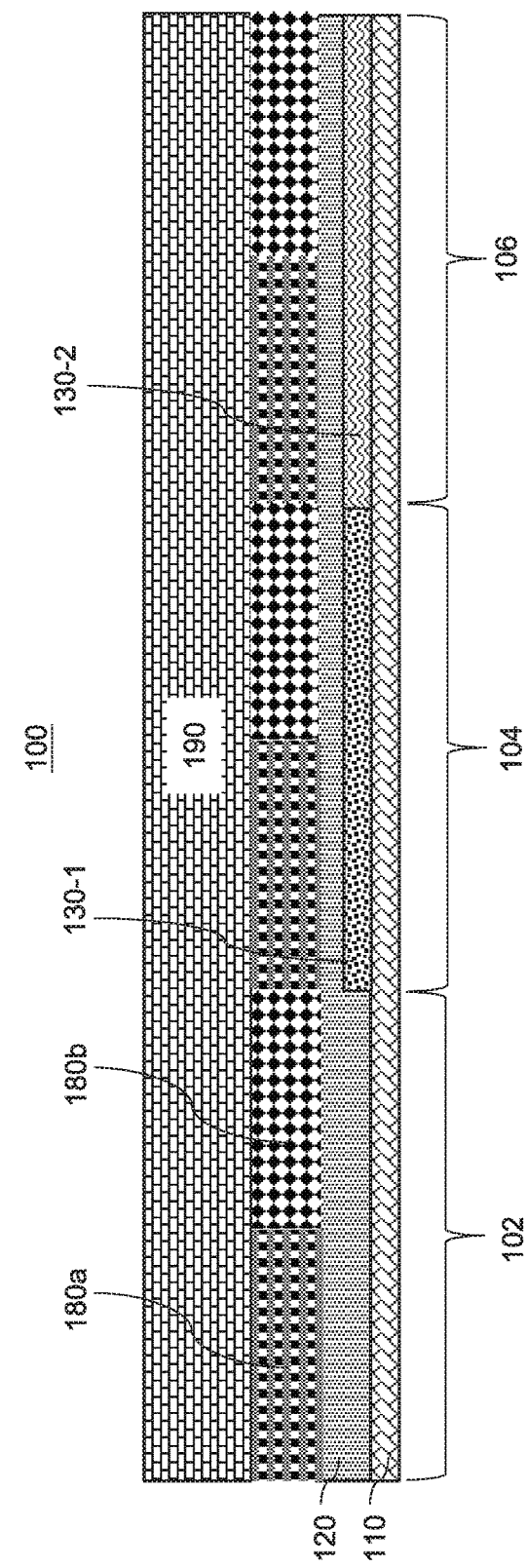
FIG. 18 is a cross-sectional view of work function metal formation during the fabrication of the semiconductor device, in accordance with an embodiment of the present invention.

Referring to FIG. 18, an n-type work function metal (NWFM) layer/stack and a p-type work function metal (PWFM) layer/stack can be formed in each of the regions 102-106, including NWFM layer 180a and PWFM layer 180b formed in region 102, to create respective NMOS and PMOS devices (e.g., NFETs and PFETs) in each of the regions 102-106. The NWFM and PWFM layers can include any suitable materials in accordance with the embodiments described herein. As further shown, a gate electrode 190 can be formed on the NWFM and PWFM layers. The gate electrode 190 can include any suitable material in accordance with the embodiments described herein.

As mentioned above, FIGS. 19-27 depict the fabrication of a semiconductor device 200 including four gate regions having respective Vt's.

Referring to FIG. 19, a semiconductor device 200 is shown. It is assumed that the device 200 has just been processed in accordance with the removal of the resist 160-5 performed with reference to FIG. 15. However, the device 200 has an additional region 202, which is structurally similar to the region 102.

Referring to FIG. 20, sacrificial layers 250 and 240-1 are formed. The material of the sacrificial layer 240-1 can be selected based at least in part on etch resistance properties of the material of the sacrificial layer 250. In one embodiment, the sacrificial layer 240-1 can include titanium nitride (TiN). In one embodiment, the sacrificial layer 240-1 has a thickness that ranges from, e.g., about 1 nm. The sacrificial layer 240-1 can be formed using any suitable process in accordance with the embodiments described herein.

Referring to FIG. 21, a patterning process is performed. In one embodiment, the patterning process includes a photolithography process. For example, as shown, a resist 260-1 can be formed on the sacrificial layer 240-1 using any suitable process in accordance with the embodiments described herein. After the resist 260-1 is formed, the resist 260-1 can be exposed to a pattern of radiation (e.g., light), and the pattern can be developed into the resist 260-1 utilizing a resist developer. After the patterning is complete, one or more etch processes can be performed to remove material from the unprotected region 202, up to the dielectric layer 120. In one embodiment, the one or more etch processes include a dry etch process, such as RIE, and a suitable wet etch process.

Figure 22:
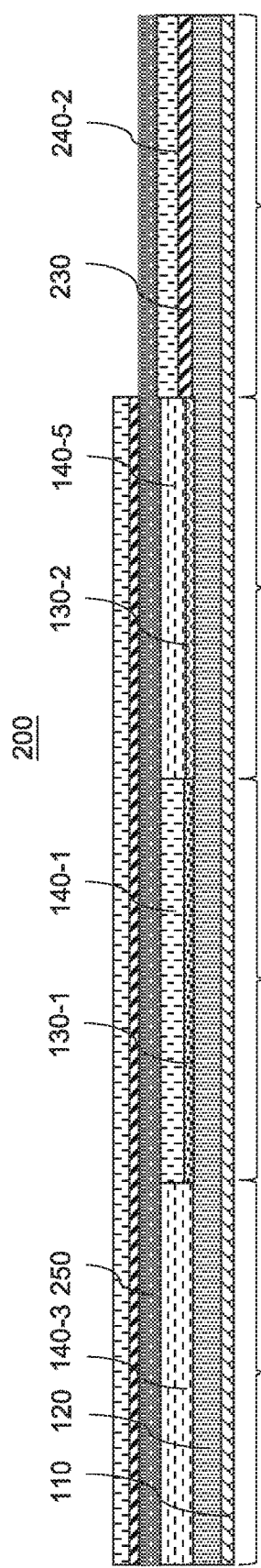
FIG. 22 is a cross-sectional view of a dipole layer and a sacrificial layer formed during the fabrication of the semiconductor device, in accordance with an alternative embodiment of the present invention.

Referring to FIG. 22, a dipole layer 230 and a sacrificial layer 240-2 are formed. The dipole layer 230 can include any suitable material in accordance with the embodiments described herein. For example, the dipole layer 230 can include at least one of $Al_2O_3$, $MgO$, $Y_2O_3$, and $La_2O_3$. In one embodiment, the dipole layer 230 can have a thickness that ranges from, e.g., about 0.5 nm to about 3 nm. In another embodiment, the dipole layer 230 can have a thickness that ranges from, e.g., about 0.5 nm to about 1.5 nm. The dipole layer 230 can be formed using any suitable process in accordance with the embodiments described herein.

The Vt corresponding to region 106 is a function of the thickness of the dipole layer 230. In one embodiment, each of the dipole layers 130-1, 130-2 and 230 include the same material, but each have different thicknesses. In another embodiment, each of the dipole layers 130-1, 130-2 and 230 include a different material (and can have the same or different thicknesses). In yet another embodiment, two of the dipole layers 130-1, 130-2 and 230 can include the same material, with the two dipole layers including the same material having different thicknesses.

The material of the sacrificial layer 240-2 can be selected based at least in part on etch resistance properties of the materials of the dipole layer 230. In one embodiment, the sacrificial layer 240-2 can include titanium nitride (TiN). In one embodiment, the sacrificial layer 240-2 has a thickness that ranges from, e.g., about 1 nm. The sacrificial layer 240-2 can be formed using any suitable process in accordance with the embodiments described herein.

Figure 23:
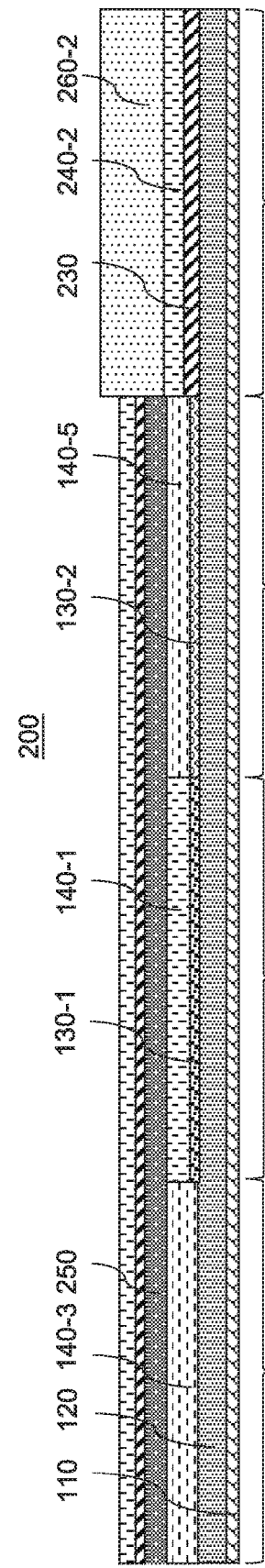
FIG. 23 is a cross-sectional view of a resist formed and patterning performed during the fabrication of the semiconductor device, in accordance with an alternative embodiment of the present invention.

Referring to FIG. 23, a resist 260-2 is formed on the sacrificial layer 240-2 in the region 202. The resist 260-2 can be formed using any suitable process in accordance with the embodiments described herein. The resist 260-2 can be exposed to a pattern of radiation (e.g., light), and the pattern can be developed into the resist 260-2 utilizing a resist developer.

Figure 24:
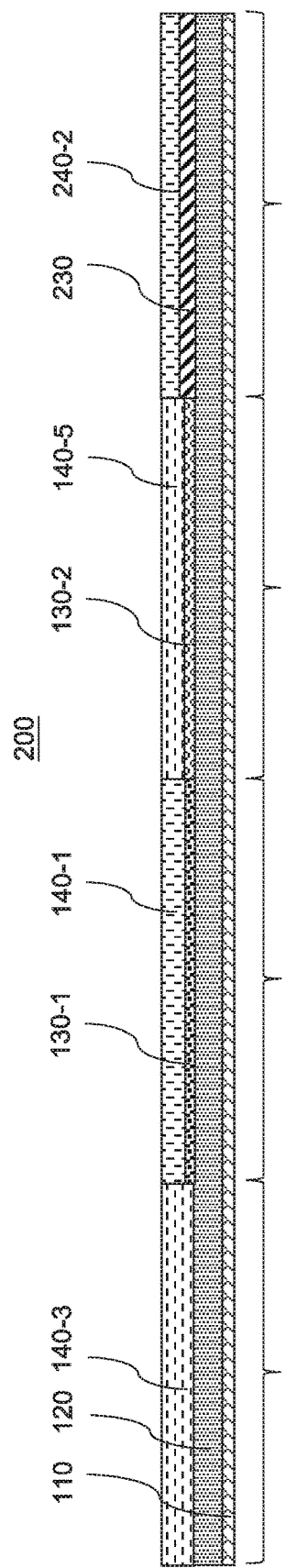
FIG. 24 is a cross-sectional view of material removed during the fabrication of the semiconductor device, in accordance with an alternative embodiment of the present invention.

Referring to FIG. 24, after the patterning is complete, one or more etch processes can be performed to remove the portions of the sacrificial layers 240-1 and 250 and the dipole layer 230 corresponding to the unprotected regions 102-106. In one embodiment, the one or more etch processes include a dry etch process, such as RIE, and a wet etch process. In the embodiment in which the sacrificial layer 240-1 includes TiN, a first solution including $H_2O_2$ (e.g., SC1) can be employed to selectively remove the sacrificial layer 240-1, and then a second solution can be employed to remove the sacrificial layer 250. The resist 260-2 is removed using any suitable resist stripping technique in accordance with the embodiments described herein.

Referring to FIG. 25, a semiconductor layer 270 is formed on the sacrificial layer 140-3 in region 102, the sacrificial layer 140-1 in region 104, the sacrificial layer 140-5 in region 106, and the sacrificial layer 140-3 in region 202. In one embodiment, the semiconductor layer 270 includes a-Si. However, the semiconductor layer 270 can include any suitable material in accordance with the embodiments described herein. A drive-in anneal can then be performed utilizing any suitable anneal process in accordance with the embodiments described herein.

Referring to FIG. 26, the semiconductor layer 270 and the remaining sacrificial layers are removed. In one embodiment, removing these layers includes employing a wet strip.

Referring to FIG. 27, an n-type work function metal (NWFM) layer/stack and a p-type work function metal (PWFM) layer/stack can be formed in each of the regions 102-106 and 202, including NWFM layer 280a and PWFM layer 280b formed in region 102, to create respective NMOS and PMOS devices (e.g., NFETs and PFETs) in each of the regions 102-106 and 202. The NWFM and PWFM layers can include any suitable materials in accordance with the embodiments described herein. As further shown, a gate electrode 290 can be formed on the NWFM and PWFM layers. The gate electrode 290 can include any suitable material in accordance with the embodiments described herein.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device including multiple pairs of threshold voltage (Vt) devices, comprising:
    forming a stack on a base structure, wherein the stack extends continuously laterally across a first region corresponding to a first pair of Vt devices, a second region corresponding to a second pair of Vt devices and a third region corresponding to a third pair of Vt devices, the stack including a first dipole layer, a first sacrificial layer formed on the first dipole layer, a second sacrificial layer formed on the first sacrificial layer, and a third sacrificial layer formed on the second sacrificial layer; and
    forming a second dipole layer different from the first dipole layer.

2. The method of claim 1, wherein the base structure includes a dielectric layer formed on an interfacial layer.

3. The method of claim 1, wherein the first, second and third sacrificial layers include a material selected based at least in part on etch resistance properties of materials included in the first dipole layer and the second sacrificial layer.

4. The method of claim 1, further comprising exposing the base structure in the third region, including:
    performing a first patterning process, including forming a first resist in the second region;
    removing the third sacrificial layer and the first resist from the second region after removing material up to the base structure from the first and third regions;
    forming a fourth sacrificial layer;
    performing a second patterning process, including forming a second resist on the fourth sacrificial layer in the first region and a third resist on the fourth sacrificial layer in the third region;
    removing the second and third resists after removing material up to the first sacrificial layer from the second region;
    forming a fifth sacrificial layer and a sixth sacrificial layer on the fifth sacrificial layer;
    performing a third patterning process, including forming a fourth resist; and
    removing the fourth resist and the sixth sacrificial layer from the first and second regions after removing material up to the base structure from the third region, wherein the second dipole layer is formed on the fifth sacrificial layer.

5. The method of claim 4, further comprising:
    forming a seventh sacrificial layer on the second dipole layer; and
    performing a fourth patterning process, including forming a fifth resist on the third region.

6. The method of claim 5, further comprising:
    forming a semiconductor layer and performing a drive-in anneal process after removing the fifth resist;
    performing a wet strip; and
    forming a set of work function metal layers in each of the regions and a gate electrode on the sets of work function metal layers.

7. The method of claim 4, wherein the base structure further includes a fourth region corresponding to a fourth Vt device, and further comprising:
    forming a seventh sacrificial layer on the second dipole layer;
    performing a fourth patterning process, including forming a fifth resist on the third region;
    forming an eighth sacrificial layer and a ninth sacrificial layer after removing the fifth resist;
    performing a fifth patterning process, including forming a sixth resist in the first, second and third regions;
    removing material up to the dielectric layer in the fourth region, and the sixth resist and the ninth sacrificial layer from the first, second and third regions; and
    forming a third dipole layer different from the first and second dipole layers.

8. The method of claim 7, further comprising:
    forming a tenth sacrificial layer on the third dipole layer;
    performing a sixth patterning process, including forming a seventh resist in the fourth region;
    removing the tenth sacrificial layer, the eighth sacrificial layer and the seventh resist;
    forming a semiconductor layer and performing a drive-in anneal process;
    performing a wet strip; and
    forming a set of work function metal layers in each of the regions and a gate electrode on the sets of work function metal layers.

9. A method for fabricating a semiconductor device including multiple pairs of threshold voltage (Vt) devices, comprising:
    forming a stack on a base structure, wherein the stack extends continuously laterally across a first region corresponding to a first pair of Vt devices, a second region corresponding to a second pair of Vt devices and a third region corresponding to a third pair of Vt devices, the stack including a first dipole layer, a first sacrificial layer formed on the first dipole layer, a second sacrificial layer formed on the first sacrificial layer, and a third sacrificial layer formed on the second sacrificial layer; and
    forming a second dipole layer different from the first dipole layer, including forming the second dipole layer to include a different material than the first dipole layer.

10. The method of claim 9, wherein the base structure includes a dielectric layer formed on an interfacial layer.

11. The method of claim 9, further comprising exposing the base structure in the third region, including:
    performing a first patterning process, including forming a first resist in the second region;
    removing the third sacrificial layer and the first resist from the second region after removing material up to the base structure from the first and third regions;
    forming a fourth sacrificial layer;
    performing a second patterning process, including forming a second resist on the fourth sacrificial layer in the first region and a third resist on the fourth sacrificial layer in the third region;
    removing the second and third resists after removing material up to the first sacrificial layer from the second region;
    forming a fifth sacrificial layer and a sixth sacrificial layer on the fifth sacrificial layer;

performing a third patterning process, including forming a fourth resist; and removing the fourth resist and the sixth sacrificial layer from the first and second regions after removing material up to the base structure from the third region, wherein the second dipole layer is formed on the fifth sacrificial layer.

12. The method of claim 11, further comprising:

forming a seventh sacrificial layer on the second dipole layer;

performing a fourth patterning process, including forming a fifth resist on the third region;

forming a semiconductor layer and performing a drive-in anneal process after removing the fifth resist;

performing a wet strip; and forming a set of work function metal layers in each of the regions and a gate electrode on the sets of work function metal layers.

13. The method of claim 11, wherein the base structure further includes a fourth region corresponding to a fourth Vt device, and further comprising:

forming a seventh sacrificial layer on the second dipole layer;

performing a fourth patterning process, including forming a fifth resist on the third region;

forming an eighth sacrificial layer and a ninth sacrificial layer after removing the fifth resist;

performing a fifth patterning process, including forming a sixth resist in the first, second and third regions;

removing material up to the dielectric layer in the fourth region, and the sixth resist and the ninth sacrificial layer from the first, second and third regions; and forming a third dipole layer different from the first and second dipole layers.

14. The method of claim 13, further comprising:

forming a tenth sacrificial layer on the third dipole layer;

performing a sixth patterning process, including forming a seventh resist in the fourth region;

removing the tenth sacrificial layer, the eighth sacrificial layer and the seventh resist;

forming a semiconductor layer and performing a drive-in anneal process;

performing a wet strip; and forming a set of work function metal layers in each of the regions and a gate electrode on the sets of work function metal layers.

15. A method for fabricating a semiconductor device including multiple pairs of threshold voltage (Vt) devices, comprising:

forming a stack on a base structure, wherein the stack extends continuously laterally across a first region corresponding to a first pair of Vt devices, a second region corresponding to a second pair of Vt devices and a third region corresponding to a third pair of Vt devices, the stack including a first dipole layer including a dipole material, a first sacrificial layer formed on the first dipole layer, a second sacrificial layer formed on the first sacrificial layer, and a third sacrificial layer formed on the second sacrificial layer; and forming a second dipole layer different from the first dipole layer, including forming the second dipole layer to include the dipole material having a different thickness.

16. The method of claim 15, wherein the base structure includes a dielectric layer formed on an interfacial layer.

17. The method of claim 15, further comprising exposing the base structure in the third region, including:

performing a first patterning process, including forming a first resist in the second region;

removing the third sacrificial layer and the first resist from the second region after removing material up to the base structure from the first and third regions;

forming a fourth sacrificial layer;

performing a second patterning process, including forming a second resist on the fourth sacrificial layer in the first region and a third resist on the fourth sacrificial layer in the third region;

removing the second and third resists after removing material up to the first sacrificial layer from the second region;

forming a fifth sacrificial layer and a sixth sacrificial layer on the fifth sacrificial layer;

performing a third patterning process, including forming a fourth resist; and removing the fourth resist and the sixth sacrificial layer from the first and second regions after removing material up to the base structure from the third region, wherein the second dipole layer is formed on the fifth sacrificial layer.

18. The method of claim 17, further comprising:

forming a seventh sacrificial layer on the second dipole layer;

performing a fourth patterning process, including forming a fifth resist on the third region;

forming a semiconductor layer and performing a drive-in anneal process after removing the fifth resist;

performing a wet strip; and forming a set of work function metal layers in each of the regions and a gate electrode on the sets of work function metal layers.

19. The method of claim 17, wherein the base structure further includes a fourth region corresponding to a fourth Vt device, and further comprising:

forming a seventh sacrificial layer on the second dipole layer;

performing a fourth patterning process, including forming a fifth resist on the third region;

forming an eighth sacrificial layer and a ninth sacrificial layer after removing the fifth resist;

performing a fifth patterning process, including forming a sixth resist in the first, second and third regions;

removing material up to the dielectric layer in the fourth region, and the sixth resist and the ninth sacrificial layer from the first, second and third regions; and forming a third dipole layer different from the first and second dipole layers.

20. The method of claim 19, further comprising:

forming a tenth sacrificial layer on the third dipole layer;

performing a sixth patterning process, including forming a seventh resist in the fourth region;

removing the tenth sacrificial layer, the eighth sacrificial layer and the seventh resist;

forming a semiconductor layer and performing a drive-in anneal process;

performing a wet strip; and forming a set of work function metal layers in each of the regions and a gate electrode on the sets of work function metal layers.

* * * * *